(12) United States Patent
Ishii

(10) Patent No.: US 9,771,916 B2
(45) Date of Patent: Sep. 26, 2017

(54) IGNITER SEMICONDUCTOR DEVICE, IGNITER SYSTEM, AND IGNITION COIL UNIT

(71) Applicant: FUJI ELECTRIC CO., LTD., Kawasaki-shi (JP)

(72) Inventor: Kenichi Ishii, Matsumoto Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/042,148

(22) Filed: Feb. 11, 2016

(65) Prior Publication Data
US 2016/0273508 A1    Sep. 22, 2016

(30) Foreign Application Priority Data

Mar. 20, 2015  (JP) .................................. 2015-057023

(51) Int. Cl.
*F02P 3/00*  (2006.01)
*F02P 3/055*  (2006.01)
(Continued)

(52) U.S. Cl.
CPC ........... *F02P 3/0552* (2013.01); *F02P 3/0442* (2013.01); *F02P 3/055* (2013.01); *H01T 15/00* (2013.01); *F02P 11/00* (2013.01); *H01L 27/0635* (2013.01)

(58) Field of Classification Search
CPC ........ F02P 3/0435; F02P 3/051; F02P 3/0552; F02P 3/0554; F02P 3/0556
(Continued)

(56) References Cited

U.S. PATENT DOCUMENTS 5,970,964 A * 10/1999 Furuhata ............... F02P 3/0552
                                                               123/644
6,100,728 A    8/2000  Shreve et al.
(Continued)

FOREIGN PATENT DOCUMENTS

EP           2682593 A2    1/2014
JP        2012-207669 A   10/2012
(Continued)

OTHER PUBLICATIONS

Noriyuki Hemmi et al., "A Self-isolated Single-chip Ignitor Series for Automobiles", Fuji Electric Journal, vol. 78—No. 4, Jul. 2005.
(Continued)

*Primary Examiner* — Tung X Le
(74) *Attorney, Agent, or Firm* — Rabin & Berdo, P.C.

(57) ABSTRACT

An igniter semiconductor device and an igniter system can prevent the influence of a voltage drop of an ON signal voltage input to an input terminal and the influence of a surge voltage, allow a switching element to operate reliably, and prevent an ignition failure. The igniter semiconductor device includes an external terminal including at least an input terminal, an output terminal electrically connected to an ignition coil, a ground terminal, and a power supply terminal electrically connected to a regulated power supply wire outside the igniter semiconductor device. The ignited semiconductor device further includes a switching element for controlling current flowing in the ignition coil, and a driving circuit that receives power through the power supply terminal and drives the switching element based on a signal input from the input terminal.

14 Claims, 8 Drawing Sheets

(51) Int. Cl.
 *F02P 3/04* (2006.01)
 *H01T 15/00* (2006.01)
 *F02P 11/00* (2006.01)
 *H01L 27/06* (2006.01)

(58) Field of Classification Search
 USPC .............................. 123/630, 644, 651, 656
 See application file for complete search history.

(56) References Cited

U.S. PATENT DOCUMENTS

| | | | | |
|---|---|---|---|---|
| 6,378,514 | B1* | 4/2002 | Kaminaga | F02P 3/0435 123/625 |
| 6,595,194 | B1* | 7/2003 | Ito | F02P 3/0435 123/644 |
| 8,402,954 | B2* | 3/2013 | Matsuda | F02P 9/005 123/143 B |
| 2004/0011342 | A1* | 1/2004 | Fukatsu | F02P 3/0435 123/630 |
| 2005/0162798 | A1* | 7/2005 | Kato | H03K 17/0828 361/111 |
| 2006/0244496 | A1* | 11/2006 | Kawakita | F02P 3/0552 327/110 |
| 2011/0134581 | A1 | 6/2011 | Godo et al. | |
| 2015/0041849 | A1 | 2/2015 | Gillberg et al. | |
| 2015/0084533 | A1 | 3/2015 | Naito | |

FOREIGN PATENT DOCUMENTS

| | | |
|---|---|---|
| JP | 2014-034970 A | 2/2014 |
| WO | WO 2013-038665 A1 | 3/2013 |
| WO | WO 2014-034895 A1 | 3/2014 |

OTHER PUBLICATIONS

Mario Paparo, "Controleur d'allumage de carburant completement integre", Electronique industrielle, Socitet Des Editions Radio, No. 159, Paris, France, Apr. 1, 1989.

* cited by examiner

IGNITER SEMICONDUCTOR DEVICE, IGNITER SYSTEM, AND IGNITION COIL UNIT

CROSS-REFERENCE TO RELATED APPLICATION

This application is based on, and claims priority to, Japanese Patent Application No. 2015-057023, filed on Mar. 20, 2015, contents of which are incorporated herein by reference.

BACKGROUND OF THE INVENTION

1. Field of the Invention

The present invention relates to an igniter semiconductor device connected to a primary side of an ignition coil and capable of turning on and off current flowing in the primary side, an igniter system having the igniter semiconductor device, and an ignition coil unit having the igniter semiconductor device.

2. Description of the Related Art

As an ignition device of an internal-combustion engine, an igniter system that turns on and off current flowing in a primary side of an ignition coil using a semiconductor device and allows an ignition plug to spark using high voltage generated on a secondary side of the ignition coil by electromagnetic induction is used. The igniter system comes in two systems. One is a distributer system in which an ignition coil and an igniter semiconductor device are disposed in an electronic control unit (ECU) and power is distributed to ignition plugs of respective cylinders by a mechanical mechanism. The other is an individual ignition system in which an ignition coil and an igniter semiconductor device are disposed in each ignition plug and the ignition time is adjusted for each cylinder. When the individual ignition system is employed, the igniter semiconductor device is required to have better heat resistance and reliability than the distributer system since the igniter semiconductor device is exposed to a severe environment such as temperature stress, electrical stress, and mechanical stress caused by vibration.

Conventionally, a hybrid igniter semiconductor device in which a switching element chip and a protection circuit chip are combined has been used in order to protect the device from overheat, overcurrent, and abnormal current (surge current). However, recently, a small igniter semiconductor device in which the switching element and the protection circuit are disposed on the same chip has been used.

For example, Japanese Patent Application Laid-open No. 2012-207669 discloses an igniter semiconductor device (one-chip igniter) in which an overheat protection circuit and an overcurrent protection circuit are disposed on the same chip.

Hereinafter, a conventional one-chip igniter will be described with reference to the drawings.

FIG. 7 illustrates a circuit configuration of an igniter semiconductor device 103. The igniter semiconductor device 103 includes an input terminal 2, an output terminal 3, and a ground terminal 4, through which the igniter semiconductor device 103 can be connected to an external device. The igniter semiconductor device 103 includes a switching element 5, an overheat detection circuit 8, an overcurrent detection circuit 9, pull-down NMOSs 10 and 11, a sense resistor 12, a collector-gate zener diode (CGZD) 13, a surge protection zener diode 14, a waveform shaping circuit 15, a protection diode D1, and a pull-down resistor R1, which are mounted on one chip. In this example, the switching element 5 is an insulated gate bipolar transistor (IGBT).

The input terminal 2 is connected to a gate electrode of the switching element 5. The output terminal 3 is connected to a collector electrode of the switching element 5. Moreover, the ground terminal 4 is connected to an emitter electrode of the switching element 5. When the voltage input to the input terminal 2 is higher than a threshold voltage of the switching element 5, the switching element 5 is turned on and current flows between the output terminal 3 and the ground terminal 4. When the voltage is lower than the threshold voltage, the switching element 5 is turned off and no current flows between the output terminal 3 and the ground terminal 4.

The overheat detection circuit 8 and the overcurrent detection circuit 9 are connected to a signal line that connects the input terminal 2 and the gate electrode of the switching element 5. An ON signal is a signal for turning on the switching element 5 and is also used as a power supply that supplies power to the overheat detection circuit 8 and the overcurrent detection circuit 9.

FIG. 8 illustrates a circuit configuration of an igniter system 1003 which uses the igniter semiconductor device 103. The igniter system 1003 includes an electronic control unit 203, an ignition coil unit 303, and an ignition plug 40.

The electronic control unit 203 includes a regulated power supply circuit 50 and a signal control circuit 20. The regulated power supply circuit 50 can create a power supply voltage VCC for control circuits from a battery voltage VBAT of battery 60 and supply power to the signal control circuit 20. The signal control circuit 20 includes an inverter circuit made up of a PMOS 21, a NMOS 22, and a series resistor 23. The signal control circuit 20 can control the igniter semiconductor device 103 connected via a wire L2 using the power supply voltage VCC as a power supply.

The ignition coil unit 303 includes the igniter semiconductor device 103, an ignition coil 31, and a diode 32. A positive terminal on a primary side of the ignition coil 31 is connected to the battery 60. A negative terminal on the primary side of the ignition coil 31 is connected to the output terminal 3 of the igniter semiconductor device 103 through a wire L3. A positive terminal on a secondary side of the ignition coil 31 is connected to the battery 60. A negative terminal on the secondary side of the ignition coil 31 is connected to the ignition plug 40 through the diode 32.

When an ON signal is transmitted from the signal control circuit 20 to the input terminal 2 through the wire L2, the igniter semiconductor device 103 is turned on and current flows to the primary side of the ignition coil 31. Subsequently, when an OFF signal is transmitted from the signal control circuit 20 to the input terminal 2 through the wire L2, the igniter semiconductor device 103 is turned off, the current on the primary side of the ignition coil 31 is blocked, and high voltage is generated on the secondary side of the ignition coil 31 due to electromagnetic induction. As a result, the diode 32 breaks down, the high voltage is applied to the ignition plug 40, and the ignition plug 40 sparks.

As illustrated in FIG. 7, in the conventional igniter semiconductor device 103, a driving circuit is not provided between the input terminal 2 and the gate electrode of the switching element 5. On the other hand, the pull-down resistor R1, the overheat detection circuit 8, and the overcurrent detection circuit 9 are connected to the input terminal 2, and an ON signal current flows continuously in the input terminal 2 during the ON period of the switching element 5. Since the ON signal current flows continuously, the gate voltage of the switching element 5 falls in the PMOS 21, the series resistor 23, and the wire L2 disposed in the path of the ON signal current and becomes lower than the power supply voltage VCC. When the power supply voltage VCC decreases greatly due to the influence of an external environment, the gate voltage becomes lower than the threshold voltage. Thus, the igniter semiconductor device 103 may not be turned on and an ignition failure may occur.

SUMMARY OF THE INVENTION

Therefore, an object of the present invention is to provide an igniter semiconductor device in which power is supplied from a regulated power supply outside the igniter semiconductor device, and a switching element operates stably, and an igniter sparks reliably and to provide an igniter system having the igniter semiconductor device and an ignition coil unit having the igniter semiconductor device.

In order to attain the object, an igniter semiconductor device of the present invention includes: an external terminal including at least an input terminal, an output terminal electrically connected to an ignition coil, a ground terminal, and a power supply terminal electrically connected to a regulated power supply wire outside the igniter semiconductor device; a switching element for controlling current flowing in the ignition coil; and a driving circuit that receives power through the power supply terminal and drives the switching element based on a signal input from the input terminal.

The igniter semiconductor device according to the present invention includes the power supply terminal electrically connected to the regulated power supply wire outside the igniter semiconductor device. Thus, the igniter semiconductor device can provide a wider operating range than the conventional system which uses the voltage of the input signal as a power supply voltage and can spark reliably with excellent stability.

In the igniter semiconductor device of the present invention, the switching element and the driving circuit are preferably disposed on the same chip.

According to this configuration, it is possible to reduce the size of the igniter semiconductor device.

In the igniter semiconductor device of the present invention, the regulated power supply wire is preferably a regulated power supply wire of an electronic control unit.

According to this configuration, it is possible to easily supply regulated power.

The igniter semiconductor device of the present invention preferably further includes a power supply circuit which is disposed on the chip, and the input side of which is connected to the power supply terminal and the output side of which is connected to the driving circuit.

According to this configuration, it is possible to reduce the size of the igniter system and to further stabilize the power supply voltage.

The igniter semiconductor device of the present invention preferably includes a protection circuit which is disposed on the chip and operates by receiving power from the power supply circuit so as to protect the switching element or the ignition coil.

According to this configuration, since power is supplied from the power supply circuit of the igniter semiconductor device to the protection circuit, it is possible to prevent a voltage drop of the input signal. Moreover, the protection circuit can operate even when the input signal is turned off.

The igniter semiconductor device of the present invention preferably includes a protection circuit which is disposed on the chip and operates by receiving power from the driving circuit so as to protect the switching element or the ignition coil.

According to this configuration, since power is supplied from the driving circuit of the igniter semiconductor device to the protection circuit, it is possible to prevent a voltage drop of the input signal. Moreover, since the protection circuit operates upon receiving the output of the driving circuit only, it is possible to reduce the probability of malfunction of the protection circuit.

An igniter system of the present invention preferably includes an electronic control unit in which the igniter semiconductor device is included.

According to this configuration, since the igniter semiconductor device is disposed at a distance from the ignition coil, it is possible to eliminate the influence of surge and to reduce the size of the protection circuit required for anti-surge measures.

An igniter system of the present invention includes an ignition coil unit in which the igniter semiconductor device is included.

According to this configuration, an existing asset of the ignition coil unit in which the igniter semiconductor device is included an ignition coil can be used as it is.

An ignition coil unit of the present invention is an ignition coil unit in which the igniter semiconductor device is included, including: a circuit board; a regulated power supply circuit which is disposed in the circuit board, and the input side of which is electrically connected to a power supply wire outside the ignition coil unit and the output side of which is electrically connected to a regulated power supply wire; the igniter semiconductor device electrically connected to the regulated power supply wire; and a resin member that seals the circuit board, the regulated power supply circuit, and the igniter semiconductor device.

According to this configuration, since the ignition coil unit is independent from the power supply line of the electronic control unit, noise can rarely enter the electronic control unit. Moreover, since the circuit board, the regulated power supply circuit, and the igniter semiconductor device are resin-sealed collectively, these elements can be easily mounted in an engine room and the space can be saved.

The igniter semiconductor device according to the present invention includes the power supply terminal electrically connected to the regulated power supply wire outside the igniter semiconductor device. Thus, the igniter semiconductor device can provide a wider operating range than the conventional system which uses the voltage of the input signal as a power supply voltage and can spark reliably with excellent stability.

DETAILED DESCRIPTION

Figure 1:
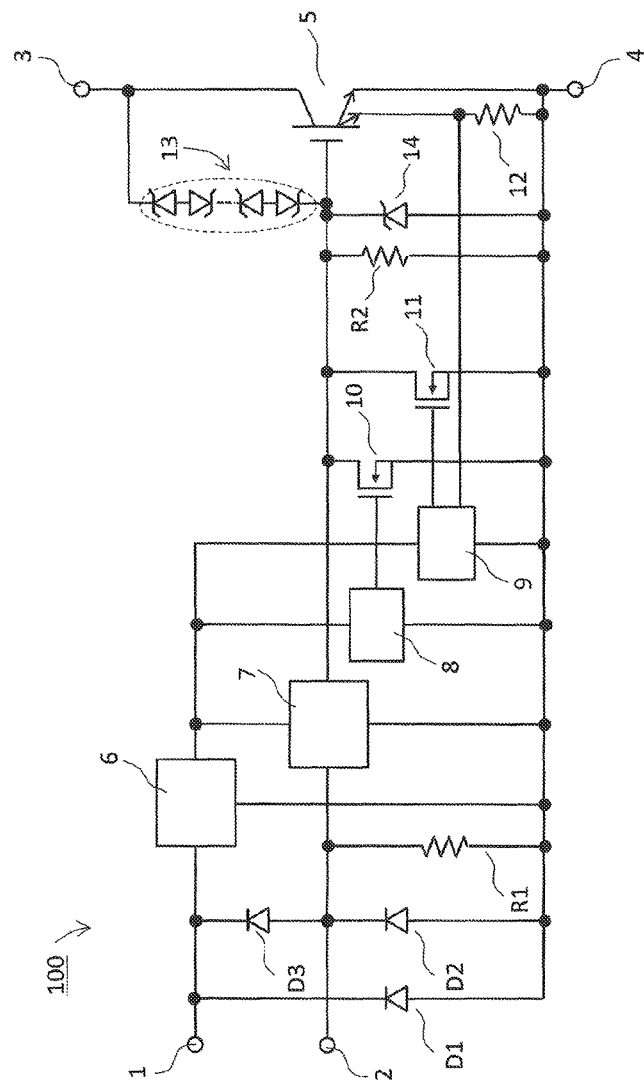
FIG. 1 is a circuit diagram illustrating an embodiment of an igniter semiconductor device according to the present invention.

A configuration of an igniter semiconductor device according to the present invention will be described with reference to the drawings. The same constituent elements as those of the conventional structure will be denoted by the same reference numerals.

First Embodiment

FIG. 1 illustrates a circuit diagram of an igniter semiconductor device 100 according to the present invention as an example. The igniter semiconductor device 100 includes at least a power supply terminal 1, an input terminal 2, an output terminal 3, and a ground terminal 4, through which the igniter semiconductor device 100 can be connected to an external device. The igniter semiconductor device 100 includes a switching element 5, a power supply circuit 6, a driving circuit 7, an overheat detection circuit 8, an overcurrent detection circuit 9, pull-down NMOSs 10 and 11, a sense resistor 12, a collector-gate zener diode (CGZD) 13, a surge protection zener diode 14, protection diodes D1, D2, and D3, and pull-down resistors R1 and R2, which are mounted on one chip.

In the configuration described above, the power supply terminal 1 connected to a regulated power supply outside the igniter semiconductor device is connected to an input terminal of the power supply circuit 6. An output terminal of the power supply circuit 6 is connected to power supply terminals of the driving circuit 7, the overheat detection circuit 8, and the overcurrent detection circuit 9. The input terminal 2 connected to a signal control circuit outside the igniter semiconductor device is connected to an input terminal of the driving circuit 7. The output terminal of the driving circuit 7 is connected to a gate electrode of the switching element 5. The output terminal 3 is connected to a collector electrode of the switching element 5. The ground terminal 4 is connected to an emitter electrode of the switching element 5. Moreover, the pull-down NMOS 10 which is turned on when the overheat detection circuit 8 detects overheat and the pull-down NMOS 11 which is turned on when the overcurrent detection circuit 9 detects overcurrent are connected to a wire that connects the driving circuit 7 and the gate electrode of the switching element 5.

The switching element 5 used in the igniter semiconductor device 100 of the present invention is not particularly limited, and a semiconductor element which can carry high voltage and current (specifically, an insulated gate bipolar transistor (IGBT), a power metal oxide semiconductor (MOS) or the like) can be used. However, in the following description, it will be described that the switching element 5 is an IGBT.

The power supply circuit 6 used in the igniter semiconductor device 100 of the present invention is not particularly limited, and a general series regulator and a general shunt regulator can be used, for example. A series regulator can be formed by a voltage-controlled MOS transistor (or a voltage-controlled bipolar transistor), an operational amplification circuit, a reference voltage circuit, and a resistor divider which are disposed in series to a load, for example. The operational amplification circuit of the series regulator can control a gate voltage of the voltage-controlled MOS transistor by comparing a voltage negatively fed back from a drain voltage of the voltage-controlled MOS transistor and a reference voltage generated by the reference voltage circuit. The reference voltage may be supplied from a reference voltage circuit (for example, a bandgap reference circuit, an ED-type reference voltage circuit, or a reference voltage circuit which uses a breakdown voltage of a zener diode) included in the power supply circuit 6. Alternatively, the reference voltage may be input from an external terminal (not illustrated) dedicated for the reference voltage to the igniter semiconductor device 100. On the other hand, the shunt regulator can be formed by a resistor disposed in series to a power supply line and a zener diode disposed in parallel to a load, for example. The output voltage of the shunt regulator can be controlled so as not to exceed the breakdown voltage by the zener diode. The power supply circuit 6 may further include a low-pass filter (for example, a RC circuit, an LC circuit, and the like) in order to remove noise in addition to the regulator.

The driving circuit 7 used in the igniter semiconductor device 100 of the present invention can receive power from the power supply circuit 6, recover a voltage level of an input signal transmitted from the input terminal 2, increase a driving current, and turn on and off the switching element 5. The driving circuit 7 is not particularly limited, and can be formed by a CMOS inverter circuit or a TTL inverter circuit, for example. With this configuration, even when the voltage supplied to the power supply terminal 1 varies, since the voltage supplied from the power supply circuit 6 to the driving circuit 7 is stable, the output voltage of the driving circuit 7 is stable and the switching element 5 can be turned on and off reliably. Moreover, the driving circuit 7 can control the amount of driving current that turns on and off the switching element 5. Thus, it is possible to eliminate the waveform shaping circuit 15 which was necessary conventionally and to save the area corresponding to the waveform shaping circuit.

The overheat detection circuit 8 used in the igniter semiconductor device 100 of the present invention has a sensor unit that senses overheat when an excessively large load current flows into the switching element 5 and the igniter semiconductor device 100 is overheated by a peripheral device. Thus, the overheat detection circuit 8 can turn on the NMOS 10 to pull down the gate voltage and turn off the switching element 5. The sensor unit of the overheat detection circuit 8 is not particularly limited, and a temperature sensor which utilizes the temperature dependence of a gate-emitter voltage of a bipolar transistor can be used, for example.

The overcurrent detection circuit 9 used in the igniter semiconductor device 100 of the present invention has the sense resistor 12 that detects overcurrent flowing in a small-scale IGBT current-mirror-connected to a main IGBT of the switching element 5 as overvoltage when an excessively large load current flows into the switching element 5. Thus, the overcurrent detection circuit 9 can turn on the NMOS 11 to pull down the gate voltage and turn off the switching element 5.

Conventionally, there was a problem that the ON signal current supplied to the switching element 5 disappears by being shunted to the overheat detection circuit 8 and the overcurrent detection circuit 9. However, according to the above configuration, since power is supplied from the power supply circuit 6 to the overheat detection circuit 8 and the overcurrent detection circuit 9, it is possible to reduce a loss of the ON signal current and to suppress a voltage drop of the ON signal.

Moreover, in order to protect circuits, the protection diode D1 is connected to the power supply terminal 1, the protection diodes D2 and D3 are connected to the input terminal 2, and the collector-gate zener diode 13 and the surge protection zener diode 14 are connected to the switching element 5. Moreover, the pull-down resistors R1 and R2 are disposed in the signal line in order to prevent an unstable state of potential. The protection diodes and pull-down resistors illustrated in the drawings are examples, and the positions and the numbers thereof can be appropriately changed as necessary.

Second Embodiment

Figure 2:
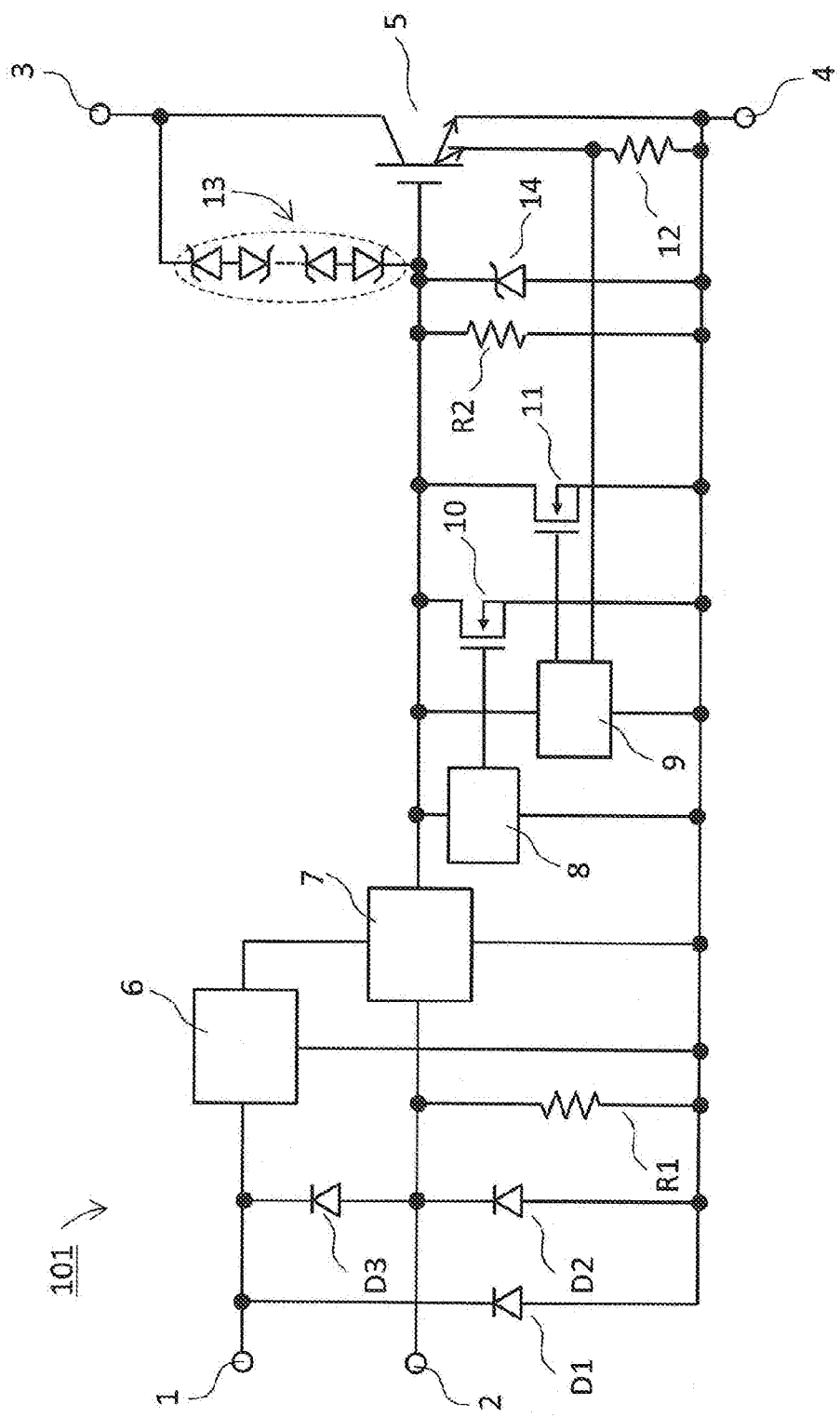
FIG. 2 is a circuit diagram illustrating another embodiment of the igniter semiconductor device according to the present invention.

FIG. 2 illustrates another embodiment of the igniter semiconductor device according to the present invention. An igniter semiconductor device 101 illustrated in FIG. 2 is different from the igniter semiconductor device 100 illustrated in FIG. 1 in that the power supply terminals of the overheat detection circuit 8 and the overcurrent detection circuit 9 are connected to the output terminal of the driving circuit 7. Since the driving circuit 7 can increase the driving current, the problem of a voltage drop or the like does not occur even when current is shunted to the overheat detection circuit 8 and the overcurrent detection circuit 9. Moreover, since power is not always supplied to the overheat detection circuit 8 and the overcurrent detection circuit 9, it is possible to prevent malfunction.

Third Embodiment

Figure 3:
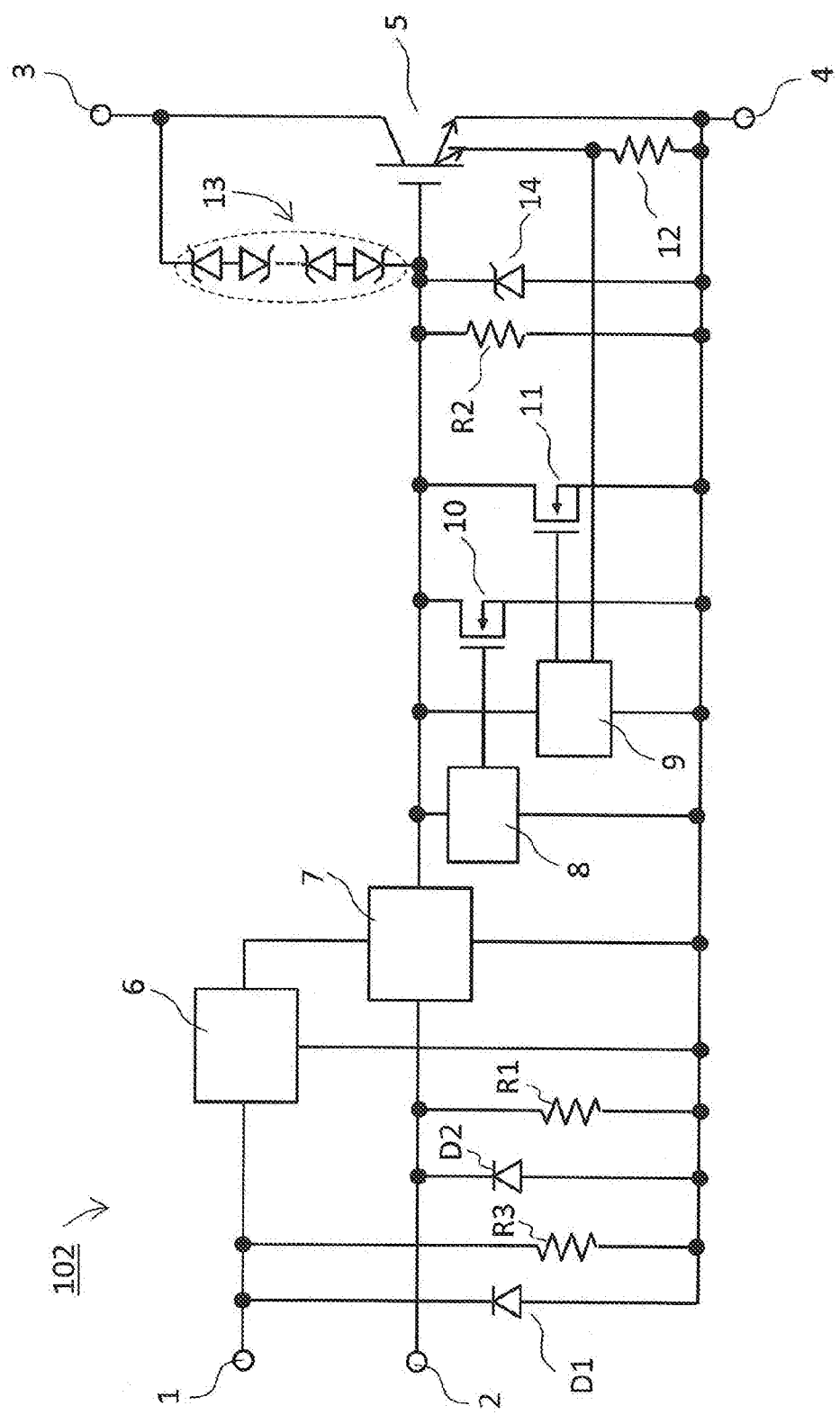
FIG. 3 is a circuit diagram illustrating still another embodiment of the igniter semiconductor device according to the present invention.

FIG. 3 illustrates still another embodiment of the igniter semiconductor device according to the present invention. An igniter semiconductor device 102 illustrated in FIG. 3 is different from the igniter semiconductor device 101 illustrated in FIG. 2 in that in addition to the difference between the igniter semiconductor devices 101 and 102, the diode D3 is removed, and a resistor R3 that connects the power supply terminal 1 and the ground terminal 4 is added.

Fourth Embodiment

Figure 4:
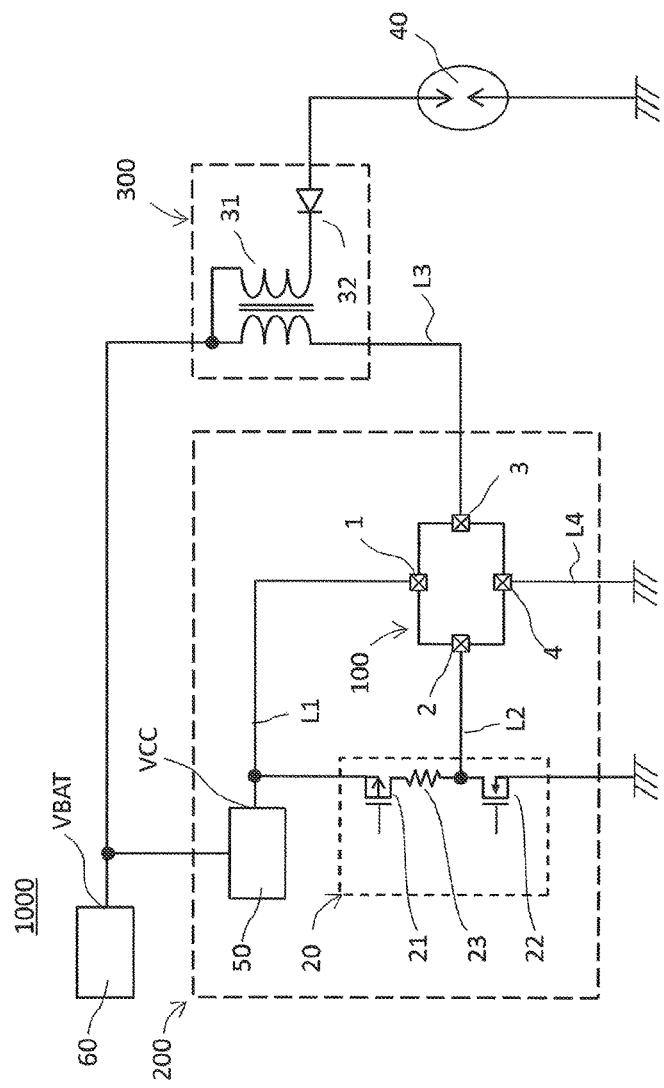
FIG. 4 is a schematic diagram illustrating an embodiment of an igniter system according to the present invention.

Next, a circuit configuration of an igniter system according to the present invention will be described with reference to FIG. 4. An igniter system 1000 includes an electronic control unit 200, an ignition coil unit 300, and an ignition plug 40.

The electronic control unit 200 includes a regulated power supply circuit 50, an igniter semiconductor device 100, and a signal control circuit 20. The regulated power supply circuit 50 can create a power supply voltage VCC for control circuits from the battery voltage VBAT of the battery 60 and supply power to the signal control circuit 20 and the igniter semiconductor device 100 through a regulated power supply wire L1. The signal control circuit 20 includes an inverter circuit made up of a PMOS 21, a NMOS 22, and a series resistor 23. The signal control circuit 20 can control the igniter semiconductor device 100 connected via a wire L2 using the power supply voltage VCC as a power supply.

The ignition coil unit 300 includes an ignition coil 31 and a diode 32. A positive terminal on a primary side of the ignition coil 31 is connected to the battery 60. A negative terminal on the primary side of the ignition coil 31 is connected to an output terminal 3 of the igniter semiconductor device 100 through a wire L3. A positive terminal on a secondary side of the ignition coil 31 is connected to the battery 60. A negative terminal on the primary side of the ignition coil 31 is connected to the ignition plug 40 through a diode 32.

When an ON signal is transmitted from the signal control circuit 20 to the input terminal 2, the igniter semiconductor device 100 is turned on and current flows to the primary side of the ignition coil 31. Subsequently, when an OFF signal is transmitted from the signal control circuit 20 to the input terminal 2, the igniter semiconductor device 100 is turned off, the current on the primary side of the ignition coil 31 is blocked, and high voltage is generated on the secondary side of the ignition coil 31 due to electromagnetic induction. As a result, the diode 32 breaks down, the high voltage is applied to the ignition plug 40, and the ignition plug 40 sparks.

The igniter semiconductor device 100 is included in the electronic control unit 200 and is separated from the ignition coil 31, the wire L2 or the like that transmits an input signal is rarely affected by a surge voltage and malfunction of the igniter semiconductor device 100 can be prevented. Moreover, since the wire is rarely affected by a surge voltage, it can be predicted that the load applied to the collector-gate zener diode 13 and the surge protection zener diode 14 is small. Thus, even when the area thereof is reduced, it is possible to secure resistance.

Moreover, since the igniter semiconductor device 100 is included in the electronic control unit 200, the power required for the igniter semiconductor device 100 can be easily supplied from the power supply voltage VCC to the power supply terminal 1 through the wire L1.

Moreover, a wire L4 connected to the ground terminal of the igniter semiconductor device 100 may be made thick so as to decrease an electrical resistance sufficiently. An abrupt increase in the voltage of the emitter electrode when the switching element 5 is turned on and a large current flows can be prevented. The igniter semiconductor device 101 or 102 may be used instead of the igniter semiconductor device 100.

Fifth Embodiment

Figure 5:
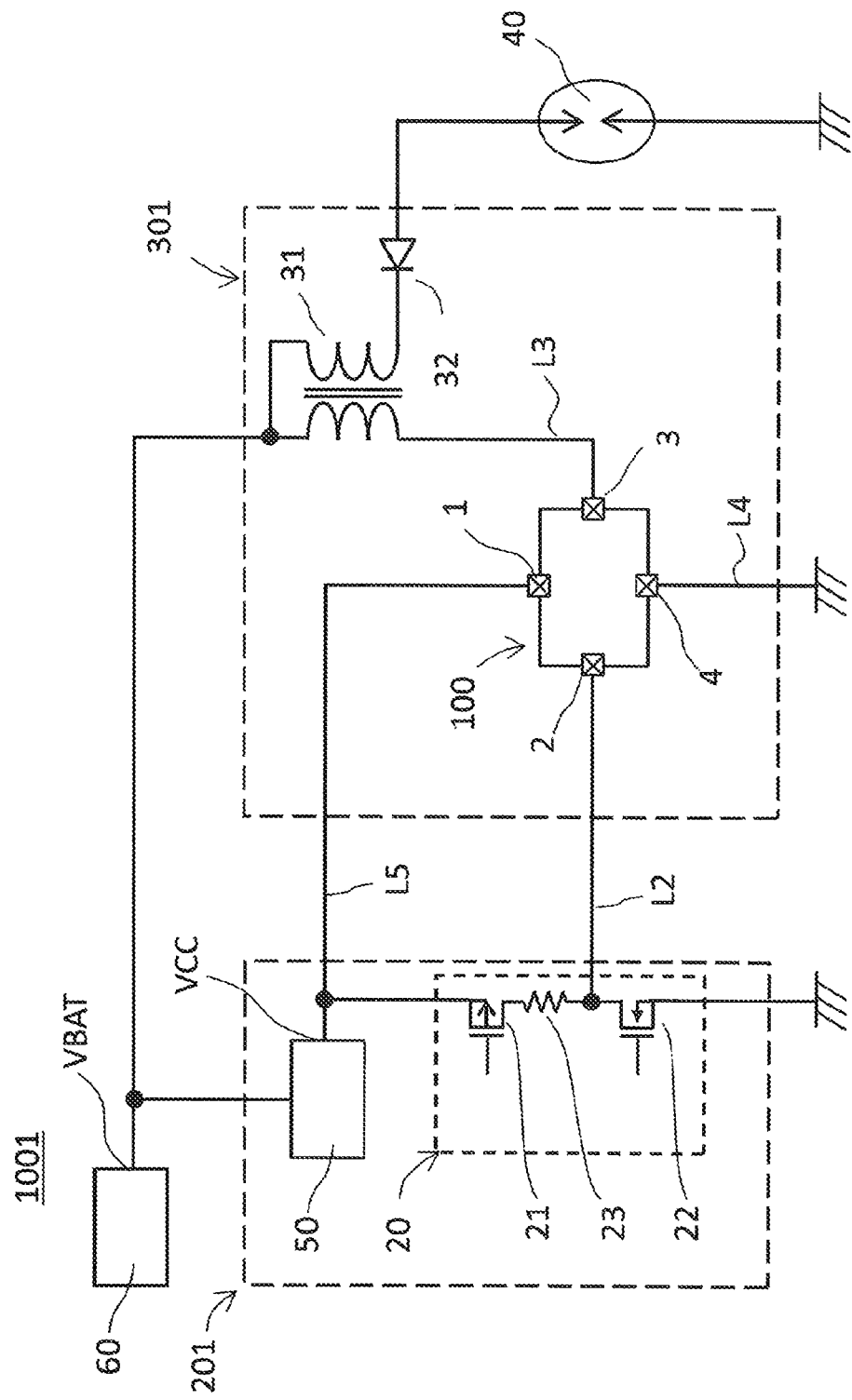
FIG. 5 is a schematic diagram illustrating another embodiment of the igniter system according to the present invention.

Another embodiment of the igniter system according to the present invention will be described with reference to FIG. 5. An igniter system 1001 includes an electronic control unit 201, an ignition coil unit 301, and an ignition plug 40.

The electronic control unit 201 includes a regulated power supply circuit 50 and a signal control circuit 20. The regulated power supply circuit 50 can create a power supply voltage VCC from a battery voltage VBAT and supply power to the signal control circuit 20. The signal control circuit 20 includes an inverter circuit made up of a PMOS 21, a NMOS 22, and a series resistor 23. The signal control circuit 20 can control the igniter semiconductor device 100 connected via a wire L2 using the power supply voltage VCC as a power supply.

The ignition coil unit 301 includes the igniter semiconductor device 100, an ignition coil 31, and a diode 32. In the present embodiment, the power supply voltage VCC is supplied from the regulated power supply circuit 50 of the electronic control unit 201 through a regulated power supply wire L5. With this configuration, even when the igniter semiconductor device 100 is included in the ignition coil unit 301, the igniter semiconductor device 100 can receive a stable voltage. The igniter semiconductor device 101 or 102 may be used instead of the igniter semiconductor device 100.

Sixth Embodiment

Figure 6:
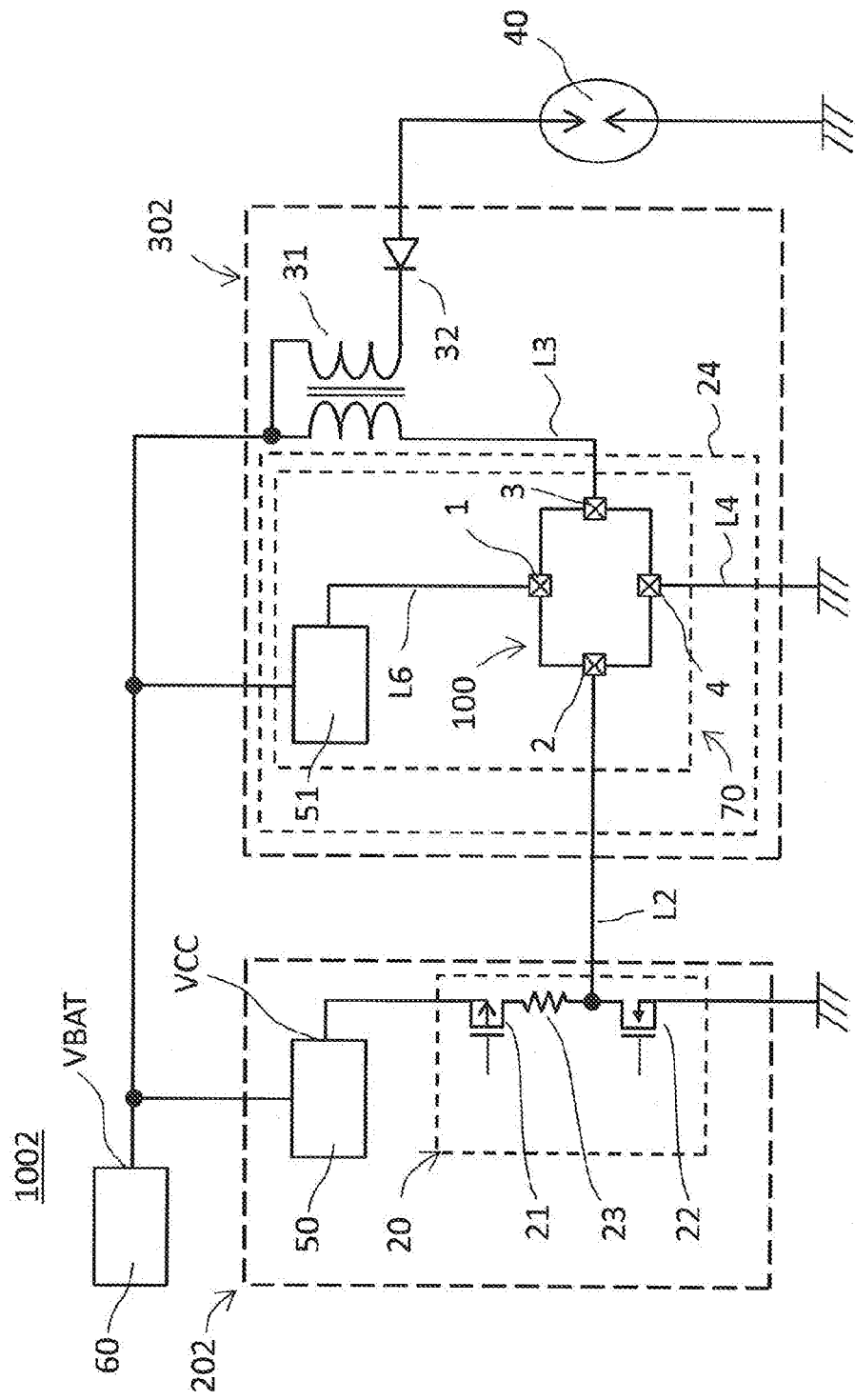
FIG. 6 is a schematic diagram illustrating still another embodiment of the igniter system according to the present invention and an example of an ignition coil unit.
Figure 7:
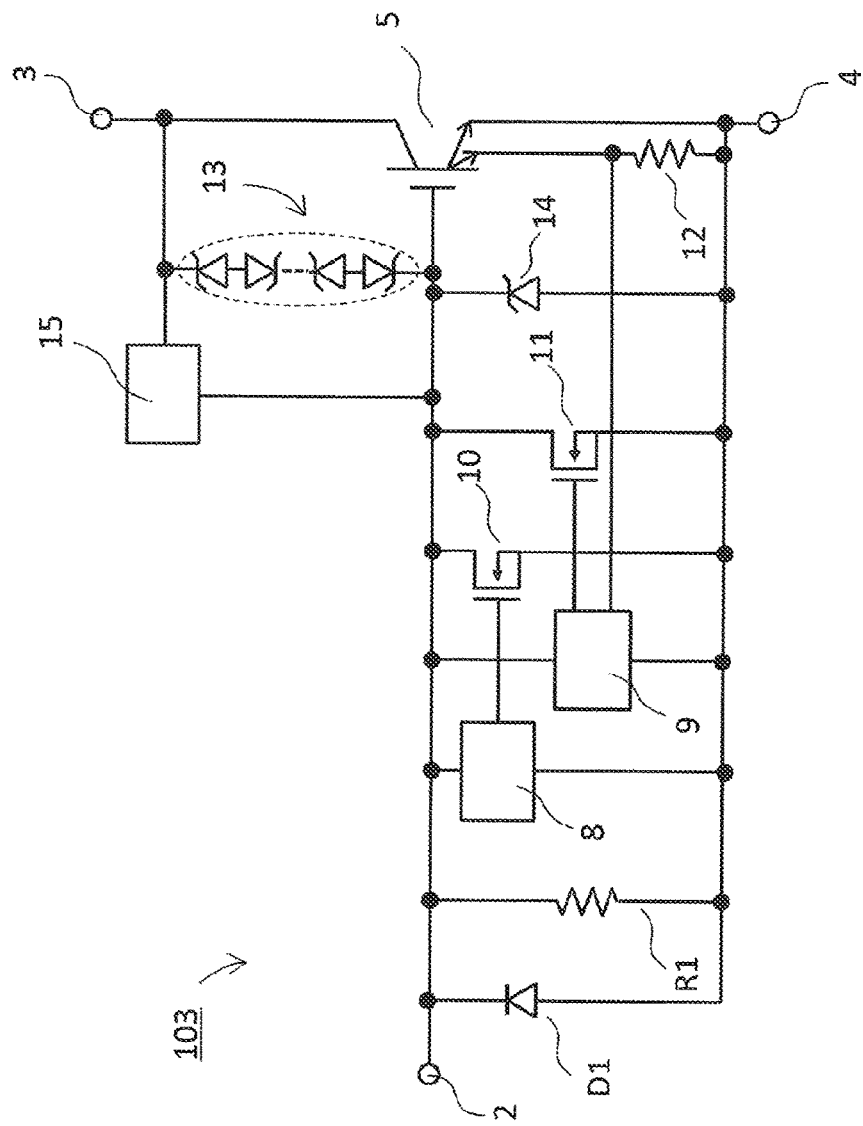
FIG. 7 is a circuit diagram illustrating an example of a conventional igniter semiconductor device.
Figure 8:
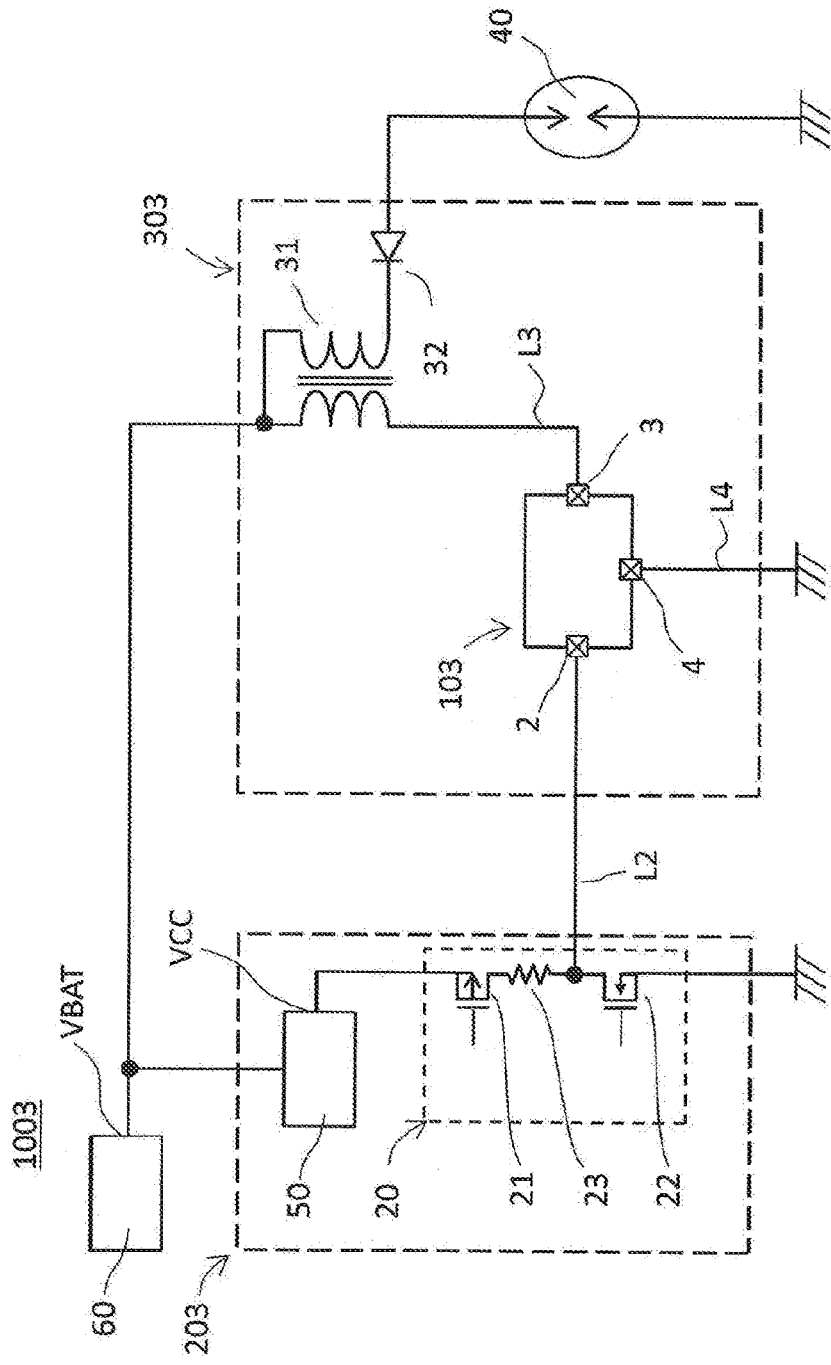
FIG. 8 is a schematic diagram illustrating an example of a conventional igniter system.

Another embodiment of the igniter system according to the present invention and an example of an ignition coil unit will be described with reference to FIG. 6. An igniter system 1002 includes an electronic control unit 202, an ignition coil unit 302, and an ignition plug 40.

Although the circuit of the electronic control unit 202 has the same configuration as that of the electronic control unit 201, a perspective view is not supplied to the igniter semiconductor device 100.

The ignition coil unit 302 includes a regulated power supply circuit 51, an igniter semiconductor device 100, a circuit board 70 in which the regulated power supply circuit 51 and the igniter semiconductor device 100 are disposed, an ignition coil 31, and a diode 32. In the present embodiment, the regulated power supply circuit 51 can create a power supply voltage VCC from a battery voltage VBAT and supply power to the igniter semiconductor device 100 connected through a regulated power supply wire L6. The input terminal 2 of the igniter semiconductor device 100 is connected to the signal control circuit 20 of the electronic control unit 202. The ground terminal 4 of the igniter semiconductor device 100 is grounded through a wire L4. A primary coil of the ignition coil 31 is connected to the battery 60, and the igniter semiconductor device 100 controls the current flowing in the primary coil. By controlling the current flowing in the primary coil, the current flowing in a secondary coil of the ignition coil 31 is controlled.

The regulated power supply circuit 51, the igniter semiconductor device 100, and the circuit board 70 are preferably resin-sealed inside the ignition coil unit 302. With this configuration, since the regulated power supply circuit 51, the igniter semiconductor device 100, and the circuit board 70 are independent from the power supply line of the electronic control unit, noise can rarely enter the electronic control unit. Moreover, since the circuit board, the regulated power supply circuit, and the igniter semiconductor device are resin-sealed collectively, these elements can be easily mounted in the ignition coil unit 302 and the space can be saved. Moreover, since the distance between the igniter semiconductor device and the coil is small, the resistance and L-components of wires decrease, the delay in the ON or OFF signal decreases, and highly accurate control can be realized.

The igniter semiconductor device 101 or 102 may be used instead of the igniter semiconductor device 100. The ignition coil 31 includes a primary coil, a secondary coil, and a metal member that passes through the respective coils to form a closed circuit of magnetic fluxes. One wire of the primary coil and one wire of the secondary coil are connected to the battery, and the other wire of the primary coil is connected to the output terminal 3 of the igniter semiconductor device 100. The other wire of the secondary coil is connected to one terminal of the ignition plug 40 through the diode 32. The other terminal of the ignition plug 40 is grounded.

A wire in the ignition coil unit 302, connected to the igniter semiconductor device 100 is electrically connected to the terminal of the ignition coil 31 by welding such as solder and is covered with a resin. Thus, it is possible to secure a withstanding voltage between the wire and the ignition coil 31 and to reduce the influence from an external environment.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents. It will be understood that the above description of the exemplary embodiments of the invention are susceptible to various modifications, changes and adaptations, and the same are intended to be comprehended within the meaning and range of equivalents of the appended claims.

EXPLANATION OF REFERENCE NUMERALS

1: Power supply terminal
2: Input terminal
3: Output terminal
4: Ground terminal
5: Switching element
6: Power supply circuit
7: Driving circuit
8: Overheat detection circuit
9: Overcurrent detection circuit
10, 11: Pull-down NMOS
12: Sense resistor
13: Collector-gate zener diode (CGZD)
14: Surge protection zener diode
15: Waveform shaping circuit
20: Signal control circuit
21: PMOS
22: NMOS
23: Series resistor
24: Sealing resin
31: Ignition coil
32: Diode
40: Ignition plug
50, 51: Regulated power supply circuit
60: Battery
70: Circuit board
100, 101, 102, 103: Igniter semiconductor device
200, 201, 202, 203: Electronic control unit
300, 301, 302, 303: Ignition coil unit
1000, 1001, 1002, 1003: Igniter system
D1, D2, D3: Protection diode
R1, R2, R3: Pull-down resistor
L1, L5, L6: Regulated power supply wire
L2, L3, L4: Wire
VBAT: Battery voltage
VCC: Power supply voltage for control circuits

What is claimed is:

1. An igniter semiconductor device comprising:
an external terminal including at least an input terminal, an output terminal electrically connected to an ignition coil, a ground terminal, and a power supply terminal electrically connected to a regulated power supply wire outside the igniter semiconductor device;
a switching element for controlling current flowing in the ignition coil; and
a driving circuit that receives power through the power supply terminal and drives the switching element based on a signal input from the input terminal;

wherein
the switching element and the driving circuit are disposed on a same chip; and
the igniter semiconductor device further comprises a power supply circuit which is disposed on the chip, and an input side of which is connected to the power supply terminal and an output side of which is connected to the driving circuit.

2. The igniter semiconductor device according to claim 1, wherein
the regulated power supply wire is a regulated power supply wire of an electronic control unit.

3. The igniter semiconductor device according to claim 1, further comprising:
a protection circuit which is disposed on the chip and connected to an output portion of the power supply circuit so as to protect the switching element or the ignition coil.

4. An igniter system comprising an electronic control unit in which the igniter semiconductor device according to claim 3 is included.

5. An igniter system comprising an ignition coil unit which has the ignition coil and in which the igniter semiconductor device according to claim 3 is included.

6. The igniter semiconductor device according to claim 1, further comprising:
a protection circuit which is disposed on the chip and operates by receiving power from the driving circuit so as to protect the switching element or the ignition coil.

7. An igniter system comprising an electronic control unit in which the igniter semiconductor device according to claim 1 is included.

8. An igniter system comprising an ignition coil unit which has the ignition coil and in which the igniter semiconductor device according to claim 1 is included.

9. An ignition coil unit included in the igniter system according to claim 8, comprising:

a circuit board;
a regulated power supply circuit which is disposed in the circuit board, and an input side of which is electrically connected to a power supply wire outside the ignition coil unit and an output side of which is electrically connected to a regulated power supply wire;
the igniter semiconductor device electrically connected to the regulated power supply wire; and
a resin member that seals the circuit board, the regulated power supply circuit, and the igniter semiconductor device.

10. A semiconductor device, comprising:
a terminal configured to be coupled to a power supply;
a switching device configured to control current in an ignition coil;
a driving device configured to receive power from the power supply via the terminal and turn on and turn off the switching device in response to a control signal from a control device; and
a power supply device having an input coupled to the terminal and an output coupled to the driving device;
wherein the switching device and the power supply device are on a same chip.

11. The semiconductor device of claim 10, further comprising a protection device coupled to the power supply and configured to protect at least one of the switching device or the ignition coil from a surge voltage.

12. The semiconductor device of claim 10, wherein the terminal is coupled to a regulated power supply source.

13. The semiconductor device of claim 10, wherein the semiconductor device is included in an electronic control unit.

14. The semiconductor device of claim 10, wherein the semiconductor device is included in an ignition coil unit.

* * * * *